US009696491B2

United States Patent
Hirayama

(10) Patent No.: US 9,696,491 B2
(45) Date of Patent: Jul. 4, 2017

(54) PHOTOSENSITIVE RESIN COMPOSITION FOR OPTICAL WAVEGUIDE AND PHOTOCURABLE FILM FOR FORMATION OF OPTICAL WAVEGUIDE CORE LAYER, AS WELL AS OPTICAL WAVEGUIDE USING SAME AND MIXED-MOUNTING FLEXIBLE PRINTED WIRING BOARD FOR OPTICAL AND ELECTRICAL TRANSMISSION

(71) Applicant: NITTO DENKO CORPORATION, Ibaraki-shi, Osaka (JP)

(72) Inventor: Tomoyuki Hirayama, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/030,195

(22) PCT Filed: Oct. 24, 2014

(86) PCT No.: PCT/JP2014/078334
§ 371 (c)(1),
(2) Date: Apr. 18, 2016

(87) PCT Pub. No.: WO2015/068593
PCT Pub. Date: May 14, 2015

(65) Prior Publication Data
US 2016/0238788 A1 Aug. 18, 2016

(30) Foreign Application Priority Data
Nov. 8, 2013 (JP) ................................. 2013-231729

(51) Int. Cl.
G02B 6/36 (2006.01)
G02B 6/122 (2006.01)
G03F 7/038 (2006.01)
G02B 6/138 (2006.01)

(52) U.S. Cl.
CPC ........... G02B 6/1221 (2013.01); G02B 6/138 (2013.01); G03F 7/038 (2013.01)

(58) Field of Classification Search
USPC ........................................................ 385/141
See application file for complete search history.

(56) References Cited

U.S. PATENT DOCUMENTS

| 5,463,013 A * | 10/1995 | Tokuda | C07C 69/708 524/601 |
| 2003/0173546 A1* | 9/2003 | Hiroshi | C08L 69/00 252/500 |
| 2008/0260341 A1* | 10/2008 | Shibata | C08F 2/50 385/129 |
| 2013/0287351 A1 | 10/2013 | Hirayama | |
| 2014/0017126 A1 | 1/2014 | Kontani | |
| 2016/0252655 A1* | 9/2016 | Hirayama | G02B 1/045 385/131 |

FOREIGN PATENT DOCUMENTS

| EP | 1 818 366 A1 | 8/2007 |
| EP | 2 159 262 A2 | 3/2010 |
| EP | 2 368 939 A1 | 9/2011 |
| EP | 2 392 619 A1 | 12/2011 |
| JP | 6-281831 A | 10/1994 |
| JP | 2005-221556 A | 8/2005 |
| JP | 2010-230944 A | 10/2010 |
| JP | 2011-52225 A | 3/2011 |
| JP | 2012-215541 A | 11/2012 |
| JP | 2013-228546 A | 11/2013 |
| WO | 2010/110495 A1 | 9/2010 |

OTHER PUBLICATIONS

International Search Report dated Dec. 22, 2014, issued in counterpart International Application No. PCT/JP2014/078334 (2 pages).
Notification of Transmittal of Translation of the International Preliminary Report on Patentability (Form PCT/IB/338) issued in counterpart International Application No. PCT/JP2014/078334 mailed May 19, 2016 with Forms PCT/IB/373 and PCT/ISA/237. (11 pages).

* cited by examiner

Primary Examiner — Eric Wong
(74) Attorney, Agent, or Firm — Westerman, Hattori, Daniels & Adrian, LLP

(57) ABSTRACT

Provided is an optical waveguide photosensitive resin composition containing a resin component and a photopolymerization initiator, in which the resin component contains an aliphatic resin having a polymerizable substituent as a main component. Accordingly, when, for example, the core layer of an optical waveguide is formed by using the optical waveguide photosensitive resin composition, the optical waveguide has high transparency, and vibration absorption derived from a resin skeleton at a wavelength of 850 nm serving as the wavelength of light propagating through the optical waveguide can be avoided. As a result, a reduction in loss of the optical waveguide can be realized.

9 Claims, No Drawings

PHOTOSENSITIVE RESIN COMPOSITION FOR OPTICAL WAVEGUIDE AND PHOTOCURABLE FILM FOR FORMATION OF OPTICAL WAVEGUIDE CORE LAYER, AS WELL AS OPTICAL WAVEGUIDE USING SAME AND MIXED-MOUNTING FLEXIBLE PRINTED WIRING BOARD FOR OPTICAL AND ELECTRICAL TRANSMISSION

TECHNICAL FIELD

The embodiment of the present invention relates to an optical waveguide photosensitive resin composition and a photocurable film for forming an optical waveguide core layer each of which is to be used as a material for forming, for example, a core layer constituting an optical waveguide in a mixed flexible printed circuit board for optical/electrical transmission to be widely used in optical communication, optical information processing, and any other general optics, an optical waveguide using the composition or the film, and a mixed flexible printed circuit board for optical/electrical transmission.

BACKGROUND ART

A mixture formed of liquid photosensitive monomers has heretofore been used as an optical waveguide core layer-forming material intended for a mixed flexible printed circuit board for optical/electrical transmission, and in formation of the pattern of a core layer using the mixture, a desired core pattern has been produced by performing ultraviolet (UV) irradiation through a photomask. In general, a blending design using a resin having high aromaticity has heretofore been performed because such core layer-forming material is required to have a refractive index higher than that of a cladding layer-forming material. General approaches to the blending design for the alleviation of an optical loss at a wavelength of 850 nm in the optical waveguide core layer-forming material are mainly, for example, as described below (Patent Literatures 1 and 2). The transparency of the forming material is improved on the basis of the purity of a resin component of the forming material, thereby hindering the absorption peak thereof from shifting from a short-wavelength region to a wavelength of 850 nm, and particularly in the case of a photocurable resin material, the usage amount of a photopolymerization initiator is reduced.

RELATED ART DOCUMENT

Patent Document

[PTL 1] JP-A-2010-230944
[PTL 2] JP-A-2011-52225

SUMMARY OF INVENTION

However, when an aromatic resin skeleton is used in an optical waveguide using light having a wavelength of 850 nm as propagating light, the peak of the fourth harmonic absorption (aromatic $4\nu_{CH}$) of the vibration absorption of a C—H bond of an aromatic ring shifts to the wavelength of 850 nm, and hence the extent of a reduction in loss is limited no matter how much the transparency of a material is secured. Accordingly, an additional reduction in loss has been required in an optical waveguide to be used in an application intended for long-distance transmission. That is, the achievement of a reduction in loss through the avoidance of vibration absorption derived from a resin skeleton at a wavelength of 850 nm serving as the wavelength of light propagating through an optical waveguide has been demanded.

The embodiment of the present invention has been made in view of such circumstances, and an object of the embodiment of the present invention is to provide an optical waveguide photosensitive resin composition and a photocurable film for forming an optical waveguide core layer each capable of realizing a reduction in loss, an optical waveguide using the composition or the film, and a mixed flexible printed circuit board for optical/electrical transmission.

In order to achieve the above-mentioned object, according to a first aspect of the embodiment of the present invention, there is provided an optical waveguide photosensitive resin composition, including: a resin component; and a photopolymerization initiator, in which the resin component contains an aliphatic resin having a polymerizable substituent as a main component.

Further, according to a second aspect of the embodiment of the present invention, there is provided a photocurable film for forming an optical waveguide core layer, which is obtained by forming the optical waveguide photosensitive resin composition of the first aspect into a film shape.

Further, according to a third aspect of the embodiment of the present invention, there is provided an optical waveguide, including: a base material; a cladding layer formed on the base material; and a core layer configured to propagate an optical signal, the core layer being formed in the cladding layer in a predetermined pattern, in which the core layer is formed by curing the optical waveguide photosensitive resin composition of the first aspect or the photocurable film for forming an optical waveguide core layer of the second aspect.

Further, according to a fourth aspect of the embodiment of the present invention, there is provided a mixed flexible printed circuit board for optical/electrical transmission, including the optical waveguide of the third aspect.

The inventor of the embodiment of the present invention has made extensive investigations for obtaining a photosensitive resin composition serving as an optical waveguide core layer-forming material that has high transparency and is excellent in low loss. As a result, the inventor has found that the desired object is achieved by using a photosensitive epoxy resin composition including the blended components described above, and thus has reached the embodiment of the present invention.

The high transparency (low loss) results from a resin skeleton to be used and a related-art core layer-forming material is required to have a refractive index higher than that of a cladding layer, and hence an aromatic skeleton-containing resin is used in terms of its design, as described above. However, the waveband of propagating light having a wavelength of 850 nm overlaps the tailing of the fourth harmonic absorption ($4\nu_{CH}$) of vibration absorption derived from a C—H bond of an aromatic ring owing to the presence of the aromatic skeleton, and hence there has been a limitation on the reduction of a loss equal to or more than a certain level. In the embodiment of the present invention, material design eliminating the influence of the fourth harmonic absorption ($4\nu_{CH}$) derived from the aromatic ring has been achieved by using a core layer-forming material substantially free of an aromatic ring, i.e., free of an aromatic skeleton, the material containing a resin component containing an aliphatic resin having a polymerizable substituent as a main component.

As described above, according to the aspect of the embodiment of the present invention, the optical waveguide photosensitive resin composition, which includes: a resin component containing an aliphatic resin having a polymerizable substituent as a main component; and a photopolymerization initiator, is provided. Accordingly, when, for example, the core layer of an optical waveguide is formed by using the optical waveguide photosensitive resin composition, an aromatic resin is not used as a main component unlike a related-art composition, and hence the optical waveguide has high transparency, and vibration absorption derived from a resin skeleton at a wavelength of 850 nm serving as the wavelength of light propagating through the optical waveguide is avoided. Thus, a reduction in loss can be realized.

DESCRIPTION OF EMBODIMENTS

Next, an embodiment of the embodiment of the present invention is described in detail. However, the embodiment of the present invention is not limited to the embodiment.

<<Optical Waveguide Photosensitive Resin Composition>>

An optical waveguide photosensitive resin composition (hereinafter sometimes simply referred to as "photosensitive resin composition") of the embodiment of the present invention is obtained by using an aliphatic resin having a polymerizable substituent as a resin component and a photopolymerization initiator. In addition, the embodiment of the present invention has a feature in that the resin component contains the aliphatic resin having the polymerizable substituent as a main component. It should be noted that in the embodiment of the present invention, the term "main component" refers not only to the case where the resin component is formed only of the aliphatic resin having the polymerizable substituent but also to the case where, for example, an aliphatic resin free of a polymerizable substituent, e.g., exhibiting an action as a binder resin, is blended to the extent that the effects of the embodiment of the present invention are not impaired. The latter case means that the aliphatic resin having the polymerizable substituent serving as the main component constitutes 50 wt % or more of the entirety of the resin component. In addition, in the embodiment of the present invention, the term "liquid" or "solid" means that a substance shows a "liquid" or "solid" state under a temperature of 25° C.

Various components are sequentially described below.

<Aliphatic Resin Having Polymerizable Substituent>

Examples of the aliphatic resin having the polymerizable substituent include: polyfunctional aliphatic epoxy resins, such as a 1,2-epoxy-4-(2-oxiranyl)cyclohexane adduct of 2,2-bis(hydroxymethyl)-1-butanol; and aliphatic epoxy resins, such as 3',4'-epoxycyclohexylmethyl-3,4-epoxycyclohexane carboxylate. Further, examples of the resin exhibiting an action as a binder resin include a hydrogenated bisphenol A-type epoxy resin and a hydrogenated bisphenol F-type epoxy resin that are free of an aromatic ring. One kind of those resins is used alone, or two or more kinds thereof are used in combination. Specific examples thereof include EHPE 3150 and EHPE 3150CE (each of which is manufactured by Daicel Corporation), YX-8040, YX-8000, and YX-8034 (each of which is manufactured by Mitsubishi Chemical Corporation), ST-4000D (manufactured by Nippon Steel Chemical Co., Ltd.), and CELLOXIDE 2021P (manufactured by Daicel Corporation). It should be noted that in the embodiment of the present invention, an alicyclic epoxy resin is meant to be included as an aliphatic epoxy resin. In addition, the aliphatic resin preferably shows a solid state, and the term "solid" in this case means that the resin shows a solid state under normal temperature (25° C.) as described above.

In addition, examples of the polymerizable substituent in the aliphatic resin having the polymerizable substituent include an epoxy group, an epoxy group having an alicyclic skeleton, and a substituent having an oxetane skeleton. Of those, an epoxy group is preferred.

<Photopolymerization Initiator>

The photopolymerization initiator is used for imparting curability by light irradiation to the photosensitive resin composition, e.g., for imparting ultraviolet curability.

A photoacid generator is preferably used as the photopolymerization initiator. Examples of the photoacid generator include photoacid generators (photo-cationic curing initiator) such as benzoins, benzoin alkyl ethers, acetophenones, aminoacetophenones, anthraquinones, thioxanthones, ketals, benzophenones, xanthones, and phosphine oxides. Specific examples thereof include triphenylsulfonium hexafluoroantimonate, 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propane, 2-hydroxy-1-{4-[4-(2-hydroxy-2-methyl-propionyl)-benzyl]phenyl}-2-methyl-propan-1-one, 2-benzyl-2-dimethylamino-1-(4-morpholinophenyl)-butanone-1,2-methyl-1-(4-methylthiophenyl)-2-morpholinopropan-1-one, bis(2,4,6-trimethylbenzoyl)-phenylphosphine oxide, 2,4,6-trimethylbenzoyl-diphenyl-phosphine oxide, bis($\eta$5-2,4-cyclopentadien-1-yl)-bis[2,6-difluoro-3(1H-pyrrol-1-yl)-phenyl]titanium, and 2-hydroxy-1-{(4-[4-(2-hydroxy-2-methyl-propionyl)-benzyl]phenyl}-2-methyl-propan-1-one. One kind of those photopolymerization initiators is used alone, or two or more kinds thereof are used in combination. Of those, from the viewpoints of a high curing rate and thick film curability, triphenylsulfonium hexafluoroantimonate, 2,2-dimethoxy-1,2-diphenylethan-1-one, 1-hydroxy-cyclohexyl-phenyl-ketone, and 2-hydroxy-1-{4-[4-(2-hydroxy-2-methyl-propionyl)-benzyl]phenyl}-2-methyl-propan-1-one are preferably used.

The content of the photopolymerization initiator is set to preferably from 0.1 part by weight to 3 parts by weight, more preferably from 0.1 part by weight to 1 part by weight with respect to 100 parts by weight of the aliphatic resin having the polymerizable substituent serving as the resin component of the photosensitive resin composition. That is, when the content of the photopolymerization initiator is excessively small, satisfactory photocurability by which the composition is cured through light irradiation (ultraviolet irradiation) is hardly obtained. When the content is excessively large, the following tendency is observed: the photosensitivity of the composition rises and hence its shape becomes abnormal upon its patterning. In addition, the following tendency is observed: a required physical property concerning an initial loss deteriorates.

For example, the following additives are given as an additive to be used as required in the photosensitive resin composition of the embodiment of the present invention in addition to the aliphatic resin having the polymerizable substituent serving as the resin component and the photopolymerization initiator: adhesiveness-imparting agents for enhancing an adhesive property, such as a silane-based or titanium-based coupling agent, an olefin-based oligomer, a cycloolefin-based oligomer or polymer, e.g., a norbornenebased polymer, synthetic rubber, and a silicone compound; various antioxidants, such as a hindered phenol-based antioxidant and a phosphorus-based antioxidant; a leveling agent; and an antifoaming agent. Those additives are each appropriately blended to the extent that the effects in the embodiment of the present invention are not impaired. One kind of those additives can be used alone, or two or more kinds thereof can be used in combination.

The blending amount of the antioxidant is set to preferably less than 3 parts by weight, particularly preferably from 0.5 part by weight to 1 part by weight with respect to 100 parts by weight of the aliphatic resin having the polymerizable substituent serving as the resin component of the photosensitive resin composition. That is, when the content of the antioxidant is excessively large, the following tendency is observed: the required physical property concerning the initial loss deteriorates.

The photosensitive resin composition of the embodiment of the present invention can be prepared by stirring and mixing the aliphatic resin having the polymerizable substituent and the photopolymerization initiator, and as required, any other additive at predetermined blending ratios. Further, the materials may be stirred and dissolved in an organic solvent under heating (e.g., at from about 60° C. to about 90° C.) so that the photosensitive resin composition of the embodiment of the present invention may be prepared as a varnish for application. The usage amount of the organic solvent, which is appropriately adjusted, is set to, for example, preferably from 10 parts by weight to 80 parts by weight, particularly preferably from 10 parts by weight to 40 parts by weight with respect to 100 parts by weight of the resin component of the photosensitive resin composition (the aliphatic resin having the polymerizable substituent). That is, when the usage amount of the organic solvent is excessively small, the following tendency is observed: the viscosity of the composition prepared as the varnish for application increases and hence its applicability reduces. When the usage amount of the organic solvent is excessively large, the following tendency is observed: it becomes difficult to apply and form the varnish for application into a thick film.

Examples of the organic solvent to be used in preparing the varnish for application include ethyl lactate, methyl ethyl ketone, cyclohexanone, ethyl lactate, 2-butanone, N,N-dimethylacetamide, diglyme, diethylene glycol methyl ethyl ether, propylene glycol methyl acetate, propylene glycol monomethyl ether, tetramethylfuran, and dimethoxyethane. One kind of those organic solvents is used alone, or two or more kinds thereof are used in combination, in, for example, a predetermined amount in the above-mentioned range so that viscosity suitable for application may be obtained.

<<Optical Waveguide>>

Next, an optical waveguide obtained by using the photosensitive resin composition of the embodiment of the present invention as a material for forming its core layer is described.

The optical waveguide obtained by the embodiment of the present invention includes, for example: a base material; a cladding layer (undercladding layer) formed on the base material in a predetermined pattern; a core layer configured to propagate an optical signal, the core layer being formed on the cladding layer in a predetermined pattern; and a cladding layer (overcladding layer) formed on the core layer. In addition, the optical waveguide obtained by the embodiment of the present invention has a feature in that the core layer is formed of the photosensitive resin composition. In addition, with regard to a material for forming the under- cladding layer and a material for forming the overcladding layer, resin compositions for forming cladding layers formed of the same component composition may be used, or resin compositions of different component compositions may be used. It should be noted that in the optical waveguide obtained by the embodiment of the present invention, the cladding layers each need to be formed so as to have a refractive index smaller than that of the core layer.

In the embodiment of the present invention, the optical waveguide can be produced through, for example, the following steps. That is, the base material is prepared and a photosensitive varnish formed of a photosensitive resin composition serving as a cladding layer-forming material is applied onto the base material. The photosensitive varnish is cured by irradiating the varnish-applied surface with light, such as ultraviolet light, and subjecting the surface to a heat treatment as required. Thus, the undercladding layer (the lower portion of the cladding layers) is formed.

Next, an uncured layer for forming a core is formed by applying, onto the undercladding layer, a core layer-forming material (photosensitive varnish) obtained by dissolving the photosensitive resin composition of the embodiment of the present invention in an organic solvent. At this time, after having been applied, the core layer-forming material (photosensitive varnish) is formed into a film shape serving as an uncured photocurable film for forming an optical waveguide core layer by heating and drying the organic solvent to remove the solvent. Then, a photomask for exposing a predetermined pattern (optical waveguide pattern) is arranged on the surface of the uncured layer for forming a core, and the surface is irradiated with light, such as ultraviolet light, through the photomask and subjected to a heat treatment as required. After that, the core layer of the predetermined pattern is formed by dissolving and removing the unexposed portion of the uncured layer for forming a core with a developing solution.

Next, the photosensitive varnish formed of the photosensitive resin composition serving as the cladding layer-forming material is applied onto the core layer. After that, the overcladding layer (the upper portion of the cladding layers) is formed by irradiating the varnish with light, such as ultraviolet light, and subjecting the varnish to a heat treatment as required. The target optical waveguide can be produced through such steps.

A material for the base material is, for example, a silicon wafer, a metallic substrate, a polymer film, or a glass substrate. In addition, the metallic substrate is, for example, a stainless steel plate, such as SUS. In addition, the polymer film is specifically, for example, a polyethylene terephthalate (PET) film, a polyethylene naphthalate film, or a polyimide film. In addition, its thickness is typically set to fall within the range of from 10 μm to 3 mm.

In the light irradiation, ultraviolet irradiation is specifically performed. A light source for ultraviolet light in the ultraviolet irradiation is, for example, a low-pressure mercury lamp, a high-pressure mercury lamp, or an ultra-high pressure mercury lamp. In addition, the dose of the ultraviolet light is, for example, typically from 10 $mJ/cm^2$ to 20,000 $mJ/cm^2$, preferably from 100 $mJ/cm^2$ to 15,000 $mJ/cm^2$, more preferably from about 500 $mJ/cm^2$ to about 10,000 $mJ/cm^2$.

After the exposure by the ultraviolet irradiation, a heat treatment may be further performed for completing curing by a photoreaction. In ordinary cases, the heat treatment is performed under the conditions of a temperature in the range of from 80° C. to 250° C., preferably from 100° C. to 150°

C. and a time in the range of from 10 seconds to 2 hours, preferably from 5 minutes to 1 hour.

In addition, an example of the cladding layer-forming material is a resin composition appropriately containing any of various liquid epoxy resins and solid epoxy resins, such as a bisphenol A-type epoxy resin, a bisphenol F-type epoxy resin, a hydrogenated bisphenol A-type epoxy resin, a fluorinated epoxy resin, and an epoxy-modified silicone resin, and any of the various photoacid generators described above. The resin composition is appropriately subjected to blending design for achieving a lower refractive index than that of the core layer-forming material. Further, so that the cladding layer-forming material may be prepared and applied as a varnish as required, various conventionally known organic solvents may each be used in an appropriate amount so that viscosity suitable for application may be obtained, and various additives (an antioxidant, an adhesiveness-imparting agent, a leveling agent, and a UV absorber) may each be used in an appropriate amount to the extent that the function of the optical waveguide using the core layer-forming material is not reduced.

As described above, examples of the organic solvent to be used for preparing the varnish include ethyl lactate, methyl ethyl ketone, cyclohexanone, ethyl lactate, 2-butanone, N,N-dimethylacetamide, diglyme, diethylene glycol methyl ethyl ether, propylene glycol methyl acetate, propylene glycol monomethyl ether, tetramethylfuran, and dimethoxyethane. One kind of those organic solvents is used alone, or two or more kinds thereof are used in combination, in an appropriate amount so that viscosity suitable for application may be obtained.

It should be noted that, for example, the following methods can each be employed as an application method involving using a material for forming each layer on the base material: an application method involving using a spin coater, a coater, a circular coater, a bar coater, or the like; a method involving forming a gap by means of screen printing or a spacer and injecting the material into the gap on the basis of a capillary phenomenon; and a method involving continuously applying the material with a coater, such as a multicoater, in a roll-to-roll (R-to-R) fashion. In addition, the optical waveguide can be turned into a film-like optical waveguide by peeling and removing the base material.

The optical waveguide thus obtained can be used as, for example, an optical waveguide for a mixed flexible printed circuit board for optical/electrical transmission.

EXAMPLES

Next, the embodiment of the present invention is described by way of Examples. However, the embodiment of the present invention is not limited to these Examples. It should be noted that in Examples, the term "part(s)" means "part(s) by weight" unless otherwise stated.

Example 1

A photosensitive varnish serving as a core layer-forming material was prepared as described below.
<Preparation of Core Layer-Forming Material>
Under a light-shielding condition, 100 parts of a solid polyfunctional aliphatic epoxy resin (EHPE 3150, manufactured by Daicel Corporation), 1 part of a photoacid generator (SP-170, manufactured by ADEKA Corporation), 0.5 part of a hindered phenol-based antioxidant (SONGNOX 1010, manufactured by Kyodo Chemical Co., Ltd.), and 0.5 part of a phosphorus-based antioxidant (HCA, manufactured by Sanko Co., Ltd.) were mixed in 30 parts of ethyl lactate, and were stirred and completely dissolved under heating at 85° C. After that, the solution was cooled to room temperature (25° C.), and was then filtered under heat and pressure with a membrane filter having a diameter of 1.0 µm to prepare a photosensitive varnish serving as a core layer-forming material.

Example 2

In the preparation of the photosensitive varnish serving as the core layer-forming material, the component formulation of the aliphatic resin was changed as follows: 50 parts of a solid polyfunctional aliphatic epoxy resin (EHPE 3150, manufactured by Daicel Corporation) and 50 parts of a solid hydrogenated bisphenol A-type epoxy resin (YX-8040, manufactured by Mitsubishi Chemical Corporation). A photosensitive varnish serving as a core layer-forming material was prepared in the same manner as in Example 1 except the foregoing.

Example 3

In the preparation of the photosensitive varnish serving as the core layer-forming material, the component formulation of the aliphatic resin was changed as follows: 50 parts of a solid polyfunctional aliphatic epoxy resin (EHPE 3150, manufactured by Daicel Corporation) and 50 parts of a bifunctional alicyclic epoxy resin (3',4'-epoxycyclohexylmethyl-3,4-epoxycyclohexane carboxylate: CELLOXIDE 2021P, manufactured by Daicel Corporation). In addition, the blending amount of ethyl lactate was changed to 20 parts. A photosensitive varnish serving as a core layer-forming material was prepared in the same manner as in Example 1 except the foregoing.

Example 4

In the preparation of the photosensitive varnish serving as the core layer-forming material, the component formulation of the aliphatic resin was changed as follows: 20 parts of a solid polyfunctional aliphatic epoxy resin (EHPE 3150, manufactured by Daicel Corporation) and 80 parts of a bifunctional alicyclic epoxy resin (3',4'-epoxycyclohexylmethyl-3,4-epoxycyclohexane carboxylate: CELLOXIDE 2021P, manufactured by Daicel Corporation). In addition, the blending amount of ethyl lactate was changed to 10 parts. A photosensitive varnish serving as a core layer-forming material was prepared in the same manner as in Example 1 except the foregoing.

Example 5

In the preparation of the photosensitive varnish serving as the core layer-forming material, the component formulation of the aliphatic resin was changed as follows: 50 parts of a solid hydrogenated bisphenol A-type epoxy resin (YX-8040, manufactured by Mitsubishi Chemical Corporation) and 50 parts of a bifunctional alicyclic epoxy resin (3',4'-epoxycyclohexylmethyl-3,4-epoxycyclohexane carboxylate: CELLOXIDE 2021P, manufactured by Daicel Corporation). A photosensitive varnish serving as a core layer-forming material was prepared in the same manner as in Example 1 except the foregoing.

Example 6

In the preparation of the photosensitive varnish serving as the core layer-forming material, the component formulation of the aliphatic resin was changed as follows: 20 parts of a solid hydrogenated bisphenol A-type epoxy resin (YX-8040, manufactured by Mitsubishi Chemical Corporation) and 80 parts of a bifunctional alicyclic epoxy resin (3',4'-epoxycyclohexylmethyl-3,4-epoxycyclohexane carboxylate: CELLOXIDE 2021P, manufactured by Daicel Corporation). In addition, the blending amount of ethyl lactate was changed to 10 parts. A photosensitive varnish serving as a core layer-forming material was prepared in the same manner as in Example 1 except the foregoing.

Comparative Example 1

In the preparation of the photosensitive varnish serving as the core layer-forming material, the blending composition of the resin component was changed as follows: 100 parts of a cresol novolac-type polyfunctional epoxy resin serving as an aromatic resin (YDCN-700-10, manufactured by Nippon Steel & Sumikin Chemical Co., Ltd.). In addition, the blending amount of ethyl lactate was changed to 40 parts. A photosensitive varnish serving as a core layer-forming material was prepared in the same manner as in Example 1 except the foregoing.

Comparative Example 2

In the preparation of the photosensitive varnish serving as the core layer-forming material, the blending composition of the resin component was changed as follows: 50 parts of a solid polyfunctional aliphatic epoxy resin serving as an aliphatic resin (EHPE 3150, manufactured by Daicel Corporation) and 50 parts of a cresol novolac-type polyfunctional epoxy resin serving as an aromatic resin (YDCN-700-10, manufactured by Nippon Steel & Sumikin Chemical Co., Ltd.). In addition, the blending amount of ethyl lactate was changed to 40 parts. A photosensitive varnish serving as a core layer-forming material was prepared in the same manner as in Example 1 except the foregoing.

Comparative Example 3

In the preparation of the photosensitive varnish serving as the core layer-forming material, the blending composition of the resin component was changed as follows: 90 parts of a solid polyfunctional aliphatic epoxy resin serving as an aliphatic resin (EHPE 3150, manufactured by Daicel Corporation) and 10 parts of a liquid bisphenol A-type epoxy resin serving as an aromatic resin (JER 828, manufactured by Mitsubishi Chemical Corporation). A photosensitive varnish serving as a core layer-forming material was prepared in the same manner as in Example 1 except the foregoing.

A loss evaluation (material loss) was performed by using each of the photosensitive varnishes serving as the core layer-forming materials thus obtained in accordance with the following method. The results of the evaluation are shown in Table 1 and Table 2 to be described later together with the blending composition of each of the core layer-forming materials.

[Loss Evaluation (Material Loss)]

Each of the photosensitive varnishes obtained in Examples and Comparative Examples described above was applied onto a silicon substrate with an oxide film (thickness: 500 μm) by a spin coating method so as to have a thickness of from about 5 μm to about 10 μm. Next, the applied varnish was prebaked (100° C.×5 minutes) on a hot plate, and was then exposed to mixed beams (broad light) at 5,000 mJ (integrated at a wavelength of 365 nm), followed by post-heating (120° C.×5 minutes). Thus, a thin film was formed. Next, light having a wavelength of 850 nm was caused to enter the thin film by prism coupling, and was propagated through the thin film. Then, a propagation length was changed, and an optical intensity at the length was measured with an optical measuring system (Optical Multipower Meter Q8221, manufactured by Advantest Corporation). An optical loss was plotted against the propagation length, and the resultant graph was approximated to a straight line. A material loss in each photosensitive varnish was calculated from the gradient of the straight line, and was evaluated on the basis of the following criteria (a prism coupler method).

∘: The material loss was 0.04 dB/cm or less.
×: The result was that the material loss exceeded 0.04 dB/cm.

TABLE 1

| | | Example (Part(s)) | | | | | |
|---|---|---|---|---|---|---|---|
| | | 1 | 2 | 3 | 4 | 5 | 6 |
| Aliphatic resin | EHPE 3150 | 100 | 50 | 50 | 20 | — | — |
| | YX-8040 | — | 50 | — | — | 50 | 20 |
| | CELLOXIDE 2021P | — | — | 50 | 80 | 50 | 80 |
| Aromatic resin | YDCN-700-10 | — | — | — | — | — | — |
| | JER 828 | — | — | — | — | — | — |
| Photoacid generator | SP-170 | 1 | 1 | 1 | 1 | 1 | 1 |
| Antioxidant | Songnox 1010 | 0.5 | 0.5 | 0.5 | 0.5 | 0.5 | 0.5 |
| | HCA | 0.5 | 0.5 | 0.5 | 0.5 | 0.5 | 0.5 |
| Ethyl lactate (organic solvent) | | 30 | 30 | 20 | 10 | 30 | 10 |
| Loss evaluation | | ∘ | ∘ | ∘ | ∘ | ∘ | ∘ |
| Material loss (dB/cm) | | 0.04 | 0.04 | 0.04 | 0.04 | 0.04 | 0.04 |

TABLE 2

| | | Comparative Example (Part(s)) | | |
|---|---|---|---|---|
| | | 1 | 2 | 3 |
| Aliphatic resin | EHPE 3150 | — | 50 | 90 |
| | YX-8040 | — | — | — |
| | CELLOXIDE 2021P | — | — | — |
| Aromatic resin | YDCN-700-10 | 100 | 50 | — |
| | JER 828 | — | — | 10 |
| Photoacid generator | SP-170 | 1 | 1 | 1 |
| Antioxidant | Songnox 1010 | 0.5 | 0.5 | 0.5 |
| | HCA | 0.5 | 0.5 | 0.5 |
| Ethyl lactate (organic solvent) | | 40 | 40 | 30 |
| Loss evaluation | | x | x | x |
| Material loss (dB/cm) | | 0.06 | 0.06 | 0.05 |

As can be seen from the foregoing results, a photosensitive resin composition including a resin component containing an aliphatic resin alone (a product of Examples) provided a satisfactory evaluation result in the loss evaluation (material loss).

In contrast, a photosensitive resin composition including a resin component containing an aromatic resin in combination with an aliphatic resin, or a photosensitive resin composition including a resin component containing an aromatic resin alone provided a poor evaluation result in the loss evaluation (material loss).

[Production of Optical Waveguide]

Next, an optical waveguide was produced by using each of the photosensitive varnishes serving as the core layer-forming materials of Examples described above. First, prior to the production of the optical waveguide, a photosensitive varnish serving as a cladding layer-forming material was prepared.

<Preparation of Cladding Layer-Forming Material>

Under a light-shielding condition, 50 parts of a liquid bifunctional fluoroalkyl epoxy resin (H022, manufactured by Tosoh F-Tech, Inc.), 50 parts of a liquid bifunctional alicyclic epoxy resin (CELLOXIDE 2021P, manufactured by Daicel Corporation), 4.0 parts of a photoacid generator (ADEKAOPTOMER SP-170, manufactured by ADEKA Corporation), 0.54 part of a phosphorus-based antioxidant (HCA, manufactured by Sanko Co., Ltd.), and 1 part of a silane coupling agent (KBM-403, manufactured by Shin-Etsu Silicones) were mixed, and were stirred and completely dissolved under heating at 80° C. After that, the solution was cooled to room temperature (25° C.), and was then filtered under heat and pressure with a membrane filter having a diameter of 1.0 μm to prepare the photosensitive varnish serving as the cladding layer-forming material.

<<Production of Optical Waveguide>>

<Production of Undercladding Layer>

The photosensitive varnish serving as the cladding layer-forming material was applied onto a silicon wafer having a thickness of about 500 μm with a spin coater, followed by exposure to mixed beams (broad light) at 5,000 mJ (integrated at a wavelength of 365 nm). After that, the resultant was post-heated at 130° C. for 10 minutes to produce an undercladding layer (thickness: 20 μm).

<Production of Core Layer>

The photosensitive varnish serving as the core layer-forming material (the product of Example 1) was applied onto the formed undercladding layer with a spin coater, and then the organic solvent (ethyl lactate) was dried (130° C.×5 minutes) on a hot plate. Thus, an uncured layer in an uncured film state was formed. The formed uncured layer was subjected to mask pattern exposure [pattern width/pattern interval (L/S)=50 μm/200 μm] to mixed beams (broad light) at 9,000 mJ (integrated at a wavelength of 365 nm), and was post-heated (140° C.×5 minutes). After that, the resultant was developed (25° C.×3 minutes) in N,N-dimethylacetamide (DMAc) and washed with water, and moisture was dried (120° C.×5 minutes) on a hot plate. Thus, a core layer of a predetermined pattern (thickness: 55 μm) was produced.

Thus, the optical waveguide in which the undercladding layer was formed on the silicon wafer and the core layer of the predetermined pattern was formed on the undercladding layer was produced. The produced optical waveguide caused no problems in the production process and was satisfactory.

A specific mode in the embodiment of the present invention has been described in Examples described above, but Examples described above are merely illustrative and should not be construed as being limitative. Various modifications apparent to a person skilled in the art are meant to fall within the scope of the embodiment of the present invention.

INDUSTRIAL APPLICABILITY

The optical waveguide photosensitive resin composition of the embodiment of the present invention is useful as a material for forming a component of an optical waveguide, in particular, a core layer-forming material. In addition, an optical waveguide produced by using the optical waveguide photosensitive resin composition is used in, for example, a mixed flexible printed circuit board for optical/electrical transmission.

The invention claimed is:

1. A photocurable film for forming an optical waveguide core layer, which is obtained by forming an optical waveguide photosensitive resin composition into a film shape,
    wherein the optical waveguide photosensitive resin composition comprises:
        a resin component; and
        a photopolymerization initiator,
    wherein the resin component contains an aliphatic resin having an epoxy group as a main component, and
    wherein the optical waveguide photosensitive resin composition is substantially free of aromatic resin.

2. An optical waveguide, comprising:
    a base material;
    a cladding layer formed on the base material; and
    a core layer configured to propagate an optical signal, the core layer being formed in the cladding layer in a predetermined pattern,
    wherein the core layer is formed by curing an optical waveguide photosensitive resin composition,
    wherein the optical waveguide photosensitive resin composition comprises:
        a resin component; and
        a photopolymerization initiator,
    wherein the resin component contains an aliphatic resin having an epoxy group as a main component, and
    wherein the optical waveguide photosensitive resin composition is substantially free of aromatic resin.

3. A mixed flexible printed circuit board for optical/electrical transmission, comprising the optical waveguide of claim 2.

4. An optical waveguide, comprising:
    a base material;
    a cladding layer formed on the base material; and
    a core layer configured to propagate an optical signal, the core layer being formed in the cladding layer in a predetermined pattern,
    wherein the core layer is formed by curing the photocurable film for forming the optical waveguide core layer of claim 1.

5. A mixed flexible printed circuit board for optical/electrical transmission, comprising the optical waveguide of claim 4.

6. The photocurable film for forming an optical waveguide core layer according to claim 1, wherein the photopolymerization initiator is a photoacid generator.

7. The optical waveguide according to claim 2, wherein the photopolymerization initiator is a photoacid generator.

8. The photocurable film for forming an optical waveguide core layer according to claim 1, wherein the resin component consists of an aliphatic resin having an epoxy group.

9. The optical waveguide according to claim 2, wherein the resin component consists of an aliphatic resin having an epoxy group.

* * * * *